United States Patent [19]

Sato

[11] Patent Number: 5,412,202
[45] Date of Patent: May 2, 1995

[54] OPTICAL SIGNAL INPUT-TYPE AMPLIFIER CIRCUIT

[75] Inventor: Shinichi Sato, Kawasaki, Japan
[73] Assignee: Fujitsu Limited, Kawasaki, Japan
[21] Appl. No.: 113,808
[22] Filed: Aug. 31, 1993
[30] Foreign Application Priority Data Mar. 18, 1993 [JP] Japan .................. 5-059074

[51] Int. Cl.⁶ .............................. H01J 40/14
[52] U.S. Cl. ................ 250/214 A; 330/59; 330/306; 330/308
[58] Field of Search ............ 250/214 A; 330/300, 330/304, 306, 308, 59; 359/189

[56] References Cited

U.S. PATENT DOCUMENTS 4,750,217  6/1988  Smith et al. ............... 330/308
5,216,386  6/1993  Wyatt ....................... 330/300

FOREIGN PATENT DOCUMENTS 5152863  6/1993  Japan ....................... 330/308

Primary Examiner—William L. Sikes
Assistant Examiner—James Dudek
Attorney, Agent, or Firm—Staas & Halsey

[57] ABSTRACT

The present invention relates to an optical signal input-type amplifier circuit. The object of the invention is to provide an optical signal input-type amplifier circuit which includes a photoelectric converting element with a small light receiving surface, whereby the hf component attenuation in the amplifier can be suppressed and the drive voltage and power consumption can be reduced. The optical signal input-type amplifier is constituted of a photoelectric converting element for converting an optical input signal into an electric signal; a bias signal generating circuit for producing a predetermined bias signal; a first transistor having an output terminal, and a control terminal for receiving an input signal from the photoelectric converting element and a bias signal from the bias signal generating circuit; a second transistor cascaded to the first transistor for outputting an amplifying signal from the output terminal; a resonance circuit connected as a load to the output terminal of the second transistor for resonating to a predetermined high-frequency component; the resonance circuit being formed of a coil, a capacitor, and a resistor; a voltage dropping resistor connected between the resonance circuit and a power source; and a low pass filter connected to the resonance circuit and the voltage dropping resistor.

15 Claims, 9 Drawing Sheets

OPTICAL SIGNAL INPUT-TYPE AMPLIFIER CIRCUIT

BACKGROUND OF THE INVENTION

1. Field of the Invention

The present invention relates to an optical signal input-type amplifier circuit suitably used for a laser-type bar-code reader that is utilized for POS systems in distribution industry.

2. Description of the Related Art

Figure 8:
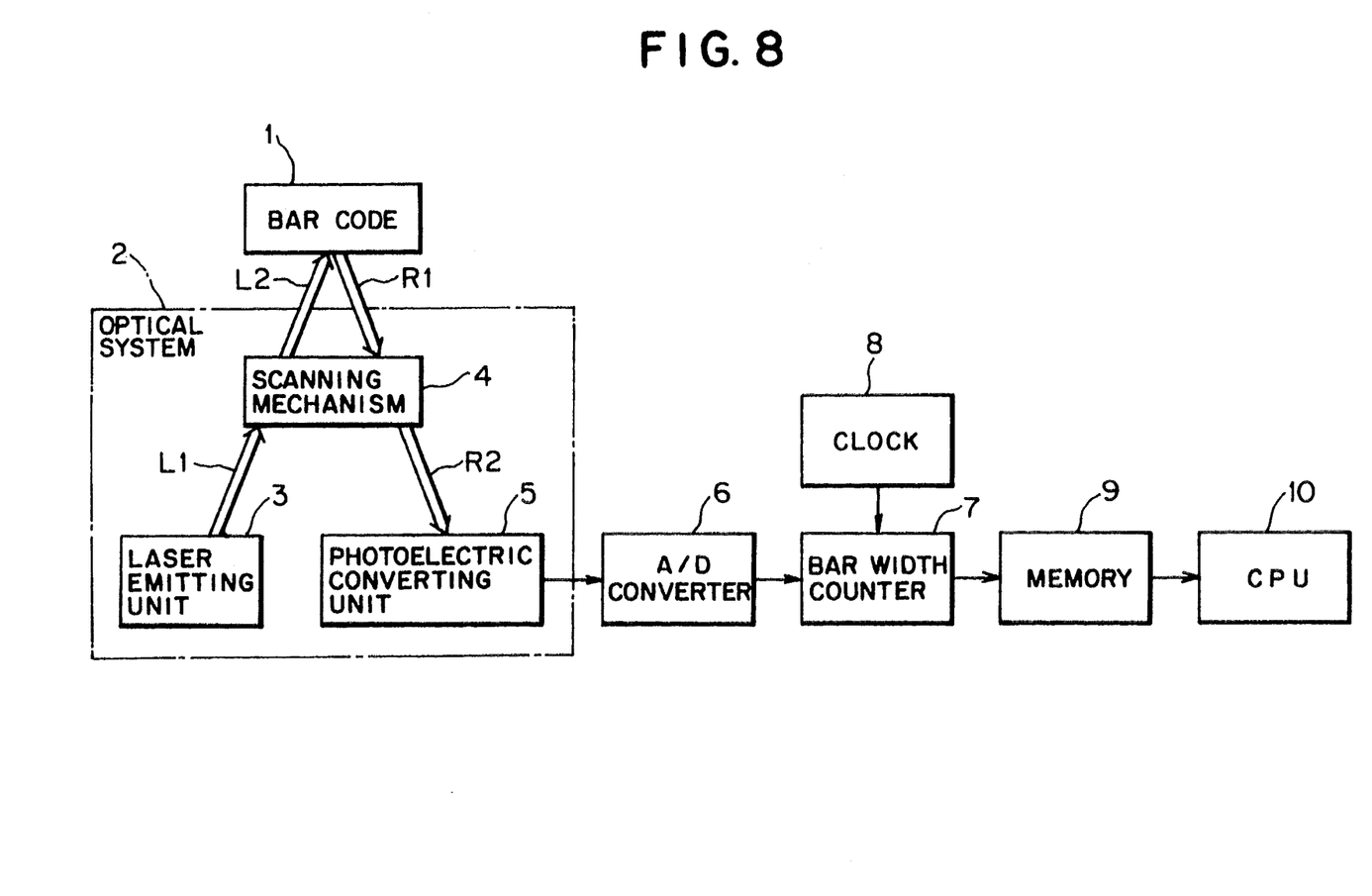
FIG. 8 is a block diagram showing an structure of a conventional bar code reader.

FIG. 8 is a block diagram showing a structure of a bar code reader. In FIG. 8, numeral 1 represents a bar code printed on a surface of a particle. The bar code 1 is formed of plural black bars and white bars arranged alternately and represents a predetermined data based on the widths of each black bar and each white bar.

The optical system 2 irradiates a laser beam L2 with respect to the bar code 1 and receives the light R1 reflected on the bar code 1. The optical system 2 also is formed of a laser emitting unit 3, a scanning mechanism 4, and a photoelectric converting unit 5.

The laser emitting unit 3 is formed of a semiconductor laser emitting a laser beam L1.

The scanning mechanism 4 is formed of, for example, a polygon mirror driven by a motor. The scanning mechanism 4 also reflects a laser beam L1 emitted from the laser beam emitting unit 3 to irradiate it as a laser beam L2 onto plural black bars and white bars of the bar code 1 while it moves and scans them at a fixed rate and perpendicularly to the black and white bars.

The scanning mechanism 4 also reflects the reflected light R1 of the laser beam L2 reflected on the bar code 1 and irradiates into the photoelectric converting unit 5 the reflection light R1 as a reflection light R2 moving while the laser beam L2 scans it.

The photoelectric converting unit 5 is formed of a photoelectric converting element such as a photo diode. The photo converting unit 5 has a function that converts a reflection light (optical input signal) R2 received via the scanning mechanism 4 into an electric signal (analog signal) corresponding to the light amount thereof and a function as an optical signal input-type amplifier circuit for amplifying the electric signal.

Figure 9:
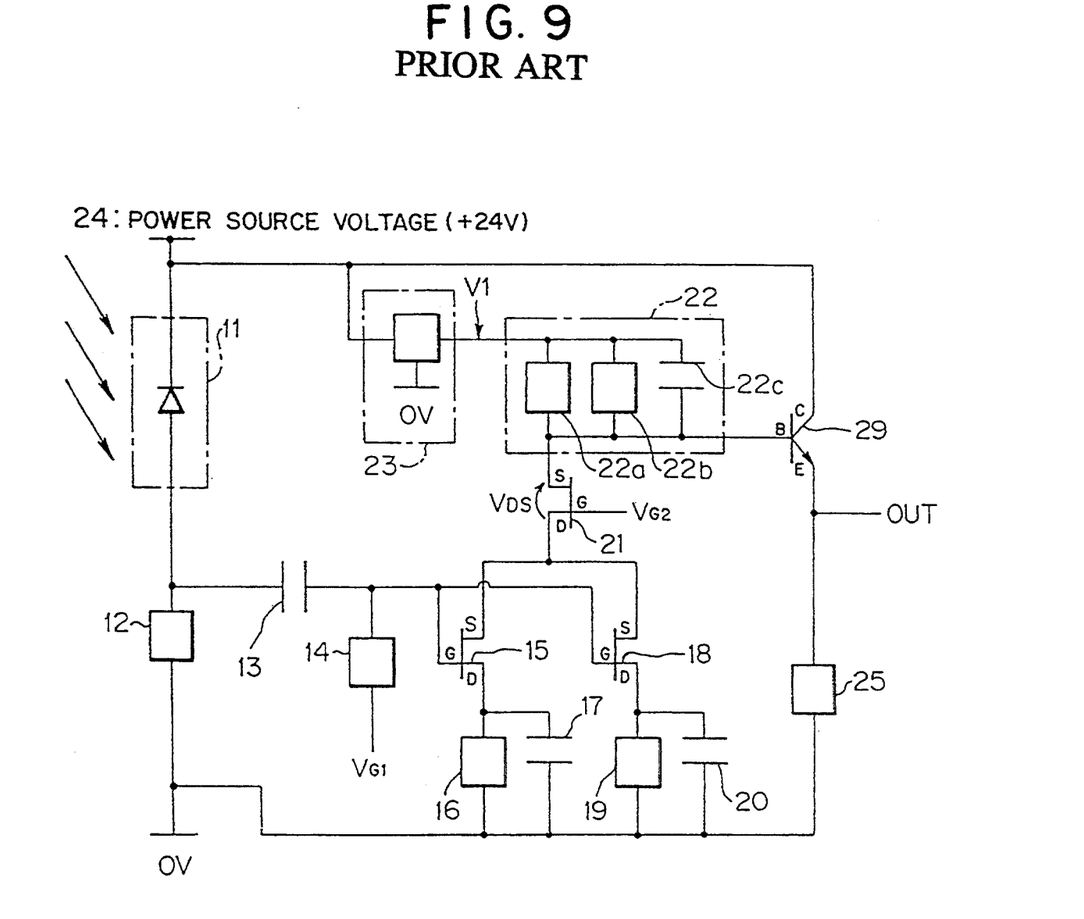
FIG. 9 is a circuit diagram showing a photoelectric converting unit as the first prior art.
Figures 10A, 10B, 10C:
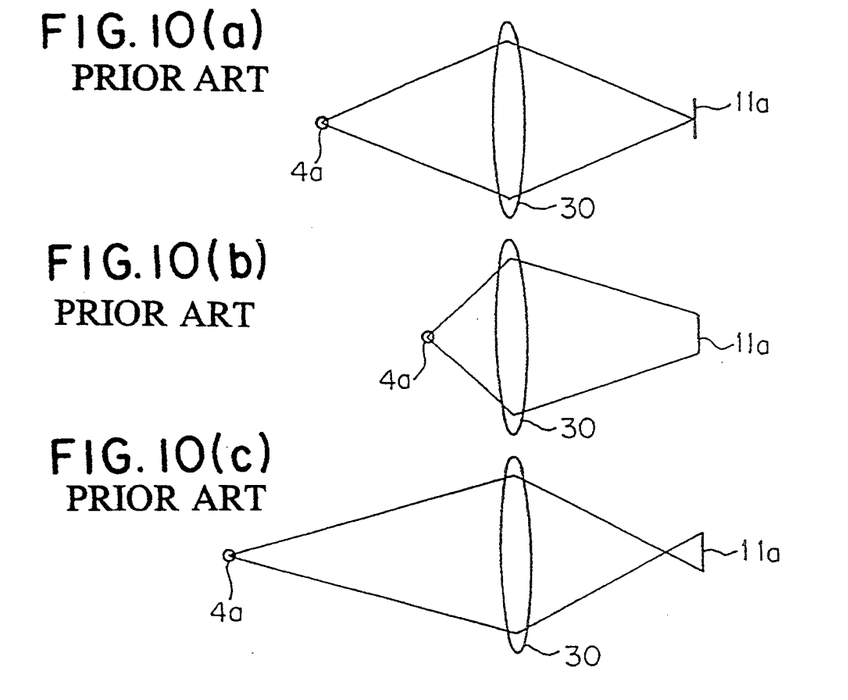
FIGS. 10(a) to 10(c) each are a diagram showing the light receiving portion of a photo diode in the photoelectric converting unit as the first prior art.

FIG. 9 is a circuit diagram showing a photoelectric converting mechanism 5, or an optical signal input-type amplifier circuit. In FIG. 9, a PIN diode 11 acting as a photoelectric converting element outputs a reverse current corresponding to the intensity of a received light. The PIN diode 11, as shown in FIG. 10(a) to 10(c), has a light receiving portion.

The scanning mechanism 4 needs a wide reading space. As shown in FIGS. 10(a) to 10(c), when the distance between the scanning spot 4a and the condensing lens 30 changes, the light may not be focused on the light receiving surface 11a because the distance between the lens 30 and the receiving surface 11a is fixed. Hence the light receiving surface 11a has a desired area for receiving a large light amount even in the above case.

In order to condense a light reflected at the scanning spot 4a in the scanning mechanism 4 shown in FIG. 8, the condensing means 30 such as a concave mirror or hologram, for example, passes light to focus an image on the light receiving surface 11a of the PIN photo diode 11.

In FIG. 9, numeral 12 represents a resistor with one end grounded, 14 represents a bias voltage applying resistor for applying a bias voltage VG1, and 13 represents a coupling capacitor. Numerals 15 and 18 represent a field effect transistor (FET), respectively. FETs 15 and 18 are connected in parallel to each other. FET 15 has a gate terminal connected to the PIN photo diode 11, and a drain terminal connected to a resistor 16 and a capacitor 17 connected in parallel to each together. FET 18 has a gate terminal connected to the PIN photo diode 11, and a drain terminal connected to a resistor 19 and a capacitor 20 connected on parallel to each other. FET 21 is cascaded to the FETs 15 and 18 with the gate terminals connected to the bias voltage VG2.

Numeral 22 represents a resonance circuit. The resonance circuit 22 is connected as a load to the source terminal of the FET 21 and resonates a predetermined high frequency component containing a frequency corresponding to the bar code information. The resonance circuit 22 is formed of a resistor 22a, a coil 22b, and a capacitor 22c connected in parallel.

The numeral 23 represents a regulator circuit. The regulator circuit 23 drops the voltage of the power source 24 by a desired voltage to make the maximum amplitude of the output signal. The circuit using a Zener diode 27 as shown in FIG. 11 may be used instead of the regulator circuit 23.

Figure 11:
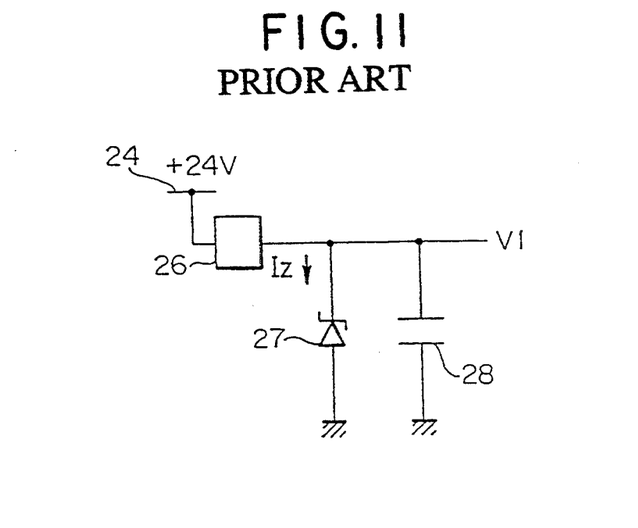
FIG. 11 is a circuit diagram showing the major portion of the photoelectric converting unit as the second prior art.

That is, the circuit shown in FIG. 11 includes a resistor 26 connected to the power source 24, and a Zener diode 27 and a capacitor 28 connected between one terminal of the resistor 26 and the ground. The resistor 26 produces a predetermined Zener current IZ flowing the Zener diode 27. The capacitor 28 absorbs a noise generated from the Zener diode 27. This circuit can drop by a voltage V1 to maximize the amplitude of the output signal. The drop voltage V1 is set so as to eliminate the difference between the voltage 24V from the power source 24 and the drain/source voltage VDS of FET 21. The drop voltage V1 is expressed by the following formula:

$$V1 = 24 - VDS \tag{1}$$

Numeral 25 represents a resistor grounded and 29 represents a bipolar transistor for outputting an output signal.

In FIG. 8, numeral 6 represents an A/D converter for converting an electric signal from the photoelectric unit 5 in a digital signal. The A/D converter 6 converts an electric signal into a binary signal including a black level signal corresponding to each black bar portion of the bar code 1 and a white level signal corresponding to each white bar portion of the bar code 1. Generally since the light amount of the light R2 reflected from each white bar portion is larger than that from each black bar portion, the white signal is produced as a high level signal and the black signal is produced as a low level signal.

Numeral 7 represents a bar width counter for counting clock signals from the clock generator 8. The bar width counter 7 produces the time widths of the black level portion and the white level portion of a binary signal from the A/D converter 6, or the values as the counted values of clock signals corresponding to each bar width and each white bar width of an actual bar code.

Furthermore, numeral 9 represents a memory for storing a bar width counted value from a bar width counter 7. The CPU 10 extracts and demodulates predetermined data in the bar code 1 based on the bar width counted value (values corresponding the width of each black bar and each white bar) stored in the memory 9.

In the above structure, the laser beam L1 emitted from the laser emitting unit 3 is irradiated as a laser beam L2 onto the black and white bars of the bar code 1 by the scanning mechanism 4. The laser beam L1 is moved and scanned at a fixed rate while it is scanned perpendicularly to the black and white bars in the bar code 1.

The laser beam L2 emitted from the scanning mechanism 4 is scattered and reflected on a portion of the bar code 1 and then is reentered to the scanning mechanism 4 as a reflection light R1. The reflection light R1 moves in accordance with the laser beam L2 scanning operation while the reflection angle is changing. Since the laser beam L2 is reflected by the polygon mirror forming the scanning mechanism 4, it is inputted as a reflection light R2 to the PIN photo diode 11 being a photoelectric converting element of the photoelectric converting unit 5 arranged at a predetermined position.

The photoelectric converting unit 5 converts reflection light R2 into an electric signal corresponding to the light amount thereof. The electric signal is amplified while the external disturbing light component is removed and it is outputted to the A/D converter 6 as the output of the photoelectric converting unit 5. The A/D converter 6 converts digitally the output into the binary signal including a black level signal correponding to each black bar portion of the bar code 1 and a white level signal correponding to each white bar portion of the bar code 1.

Then the bar width counter 7 counts the clock signals from the clock generator 8 to measure as a counted value of the clock signal the time widths (values corresponding to the width of each black bar and each white bar of an actual bar code 1) of the black and white level signals of the binary signal from the A/D converter 6. The counted value is stored once in the memory 9. The CPU 10 executes a predetermined demodulating process to the bar width counted value stored in the memory 9 to extract and demodulate the predetermined data of the bar code 1.

As described above, in the conventional optical signal input-type amplifier circuit acting as a photoelectric converting unit in a bar code reader, it is considered that a lowered voltage of the power source 24 shown in FIG. 9 or 11 is used to achieve the reduced power consumption and the improved power source working efficiency.

However, it is difficult to realize such a low voltage operation. The reason is that when the voltage of the power source 24 shown in FIGS. 9 and 11 is lowered in use, the drop voltage which occurs by the regulator 23 and the circuit using the Zener diode 27 shown in FIG. 11 must be increased because the drain to source voltage VDS of the transistor 21 is maintained without a change. Hence the difference between power source voltage and the drop voltage occurring in the above circuit must be decreased.

Furthermore, since the bar code reader is required to read at high rate, the scanning mechanism must scan the laser beam at high rate so that the signal inputted to the PIN photo diode is a high frequency signal.

For that reason, the light receiving area of the PIN photo diode must be made large and accordingly the increased parasitic capacitance of the PIN photo diode causes an attenuation of the high frequency component in the amplifier receiving the light signal.

Since the PIN photo diode with a small parasitic capacitance and a large light receiving area is expensive, the boosted manufacturing cost makes difficult to realize an optical signal input-type amplifier circuit driven on a low voltage.

It is possible to reduce the parasitic capacitance of the PIN photo diode by applying a large bias voltage thereon. However, such a countermeasure leads to a complicated circuit, an increased dark current, an increased leakage due to moisture and applied voltage, and an decreased reliability.

SUMMARY OF THE INVENTION

The present invention is made to overcome the above mentioned problems. An object of the present invention is to provide an optical signal input-type amplifier circuit including a photoelectric converting element with a small light receiving surface whereby the attenuation of a high frequency component in the amplifier is suppressed while the drive voltage and the power consumption can be reduced.

In order to achieve the above objects, the optical signal input-type amplifier circuit according to the present invention is characterized by a photoelectric converting element for converting an optical input signal into an electric signal; a bias signal generating circuit for producing a predetermined bias signal; a first transistor having an output terminal, and a control terminal for receiving an input signal from the photoelectric converting element and a bias signal from the bias signal generating circuit; a second transistor cascaded to the first transistor for outputting an amplifying signal from the output terminal; a resonance circuit connected as a load to the output terminal of the second transistor for resonating to a predetermined high-frequency component; the resonance circuit being formed of a coil, a capacitor, and a resistor; a voltage dropping resistor connected between the resonance circuit and a power source; and a low pass filter connected to the resonance circuit and to the voltage dropping resistor.

The optical signal input-type amplifier circuit according to the present invention is characterized in that the low pass filter has a cut-off frequency set so as to be lower than a target frequency of the amplifier.

Furthermore, the optical signal input-type amplifier circuit according to the present invention is characterized in that the low pass filter is formed of a high frequency cut capacitor and a resistance component of the resonance circuit, the high-frequency cut capacitor connected to the voltage dropping resistor and the resonance circuit.

An optical signal input-type amplifier circuit according to the present invention is characterized in that the resistance value of the voltage dropping resistor is set so as to equalize a drop voltage determined by a main current flowing through the first transistor, the second transistor and the voltage dropping resistor with a drop voltage of the second transistor.

Moreover, the optical signal input-type amplifier circuit according to the present invention in that the voltage dropping resistor is formed of a variable resistor.

The optical signal input-type amplifier circuit according to the present invention is characterized further by a highpass filter connected to the control terminal of the first transistor for setting the cut-off frequency near to the target frequency of the amplifier.

Furthermore, an optical signal input-type amplifier circuit according to the present invention is characterized in that the highpass filter is formed of a coupling capacitor connected to the control terminal of the first transistor, and a resistor in the bias signal producing circuit.

The optical signal input-type amplifier circuit according to the present invention is characterized in that the first transistor and the second transistor are formed of a field effect transistor, respectively.

Furthermore, the optical signal input-type amplifier circuit according to the present invention is characterized in that the first transistor is formed of a field effect transistor, and the second transistor is formed of a bipolar transistor.

The optical signal input-type amplifier circuit according to the present invention is characterized further by first condensing means and second condensing means arranged in a route carrying an optical signal to the photoelectric converting element, for condensing further the optical signal condensed by the first condensing means, the second condensing means being arranged adjacent to the light receiving surface of the photoelectric converting means.

Moreover, the optical signal input-type amplifier circuit according to the present invention is characterized in that the photoelectric converting element is formed of a photo diode, and in that the second condensing means is formed of a convex lens, the convex lens and the photo diode being encapsulating in a resin mold package, the convex lens being arranged near to the light receiving surface of the photo diode.

The optical signal input-type amplifier circuit according to the present invention is characterized in that the resin mold package is formed of a resin mold material which transmits selectively a wavelength.

Therefore, the optical signal input-type amplifier circuit according to the present invention is characterized by a photoelectric converting element for converting an optical input signal into an electric signal, a bias signal generating circuit for producing a predetermined bias signal, a first transistor having an output terminal, and a control terminal for receiving an input signal from the photoelectric converting element and a bias signal from the bias signal generating circuit, a second transistor cascaded to the first transistor for outputting an amplifying signal from the output terminal, a resonance circuit connected as a load to the output terminal of the second transistor for resonating to a predetermined high-frequency component, the resonance circuit being formed of a coil, a capacitor, and a resistor, a voltage dropping resistor connected between the resonance circuit and a power source, and a low pass filter connected to the resonance circuit and the voltage dropping resistor. Thus the expensive regulator circuit is not needed and the manufacturing cost and power consumption can be reduced.

The external disturbing light component can be suppressed by setting the cut-off frequency of the low pass filter to a frequency lower than the target frequency of the amplifier.

The low pass filter is constituted of a voltage dropping resistor and a high frequency cutting capacitor which are connected to the resonance circuit, and a resistance component of the resonance circuit so that the resistance component can be shared the function, whereby the device is effectively miniaturized.

Furthermore, the resistance value of the voltage dropping resistor is set so as to equalize the drop voltage determined by the main current flowing the first and second transistors and the voltage dropping resistor with the drop voltage of the second transistor, whereby the amplifier Can be effectively functioned.

Since the voltage dropping resistor is formed of a variable resistor, the drain to source voltage of the transistor or the collector to emitter voltage can be optimized to an optimum value so as to establish the maximum amplitude of the output signal, whereby the current Id with no variations can be outputted controllably at all times.

An external disturbing light can be suppressed effectively and certainly by arranging the highpass filter which is set to a cut-off frequency near to the target frequency of the amplifier arranged near to the first transistor control terminal.

Since the highpass filter is formed of a coupling capacitor connected to the control terminal of the first transistor and the resistor in the bias signal producing circuit, the external disturbing light can be suppressed certainly and the manufacturing cost can be reduced.

Since the first transistor and the second transistor are formed of a field effect transistor respectively, there is an advantage in that the device can be operated to its full function.

Since the first transistor is formed of a field effect transistor and the second transistor is formed of a bipolar transistor, the device can be efficiently functioned.

Furthermore, the first condensing means and the second condensing means condensing further the condensed light by the first condensing means are arranged in the optical signal input route to the photoelectric converting element. The second condensing means is arranged near to the light receiving surface of the photoelectric converting element. Hence the photoelectric converting element with a small light receiving area can be used. Such a method can lead effectively to a reduced power consumption of the amplifier circuit, an improved SN ratio, and a small-sized device.

The photoelectric converting element is formed of a photo diode. The second condensing means is formed of a convex lens. The convex lens and the photo diode is sealed in a resin mold package with the convex lens arranged so as to arrange near to the light receiving surface of the photo diode. Thus the circuit structure can be realized at a reduced manufacturing cost.

Furthermore, since the resin mold package is formed of a resin mold material transmitting selectively a wavelength, the external disturbing light can be removed at a light receiving stage. It is possible to facilitate the hard structure of the amplifier circuit so that the manufacturing cost can be effectively reduced.

DESCRIPTION OF THE PREFERRED EMBODIMENTS

Referring to the attached drawings, an explanation will be made in detail as for preferred embodiments of the optical signal input-type amplifier circuit according to the present invention.

Figure 1:
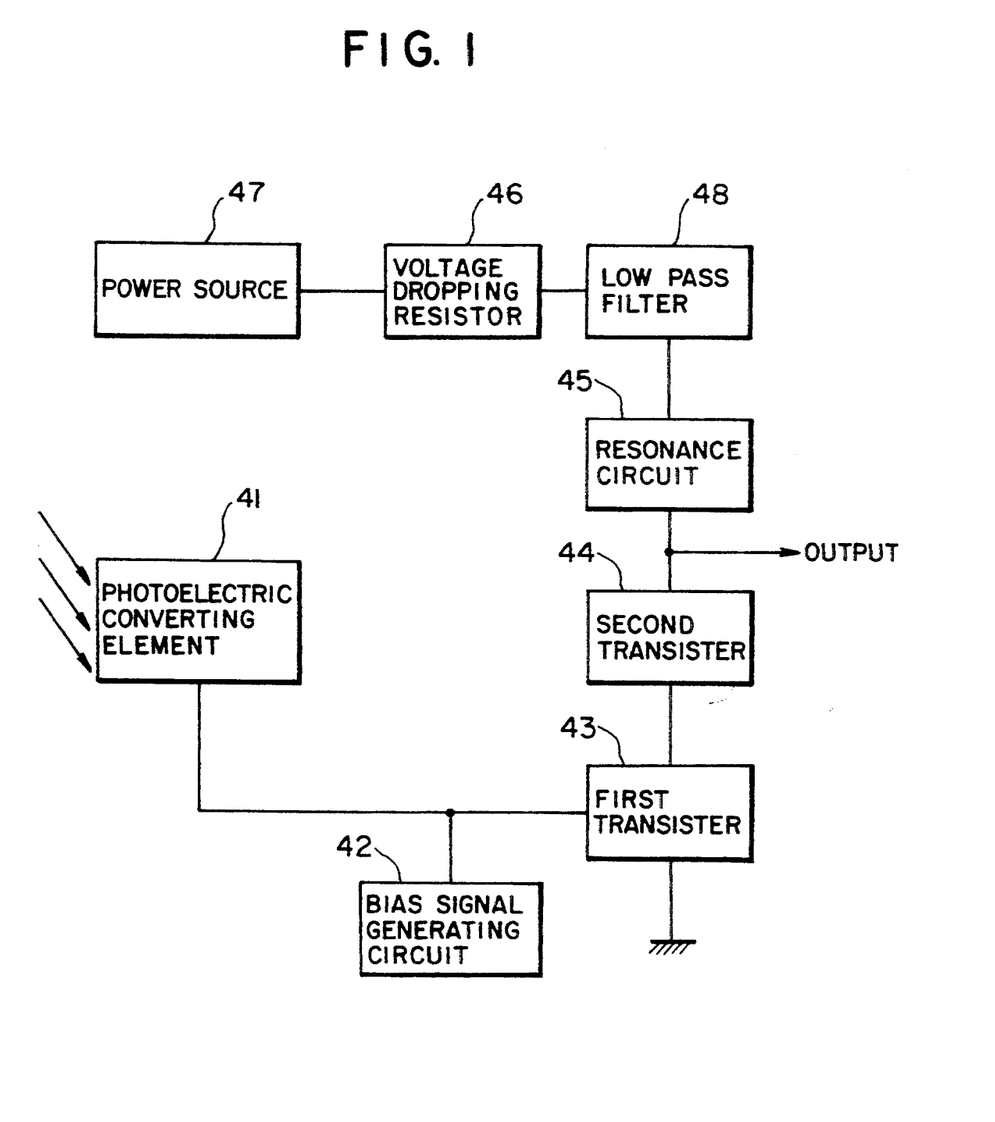
FIG. 1 is a block diagram showing the principle of the present invention.

(a) Explanation of the principle of the invention:

FIG. 1 is a block diagram showing the principle of the present invention. In FIG. 1, numeral 41 represents a photoelectric converting element. The photoelectric converting element 41 converts an optical input signal into an electric signal. Numeral 42 represents a bias signal producing circuit for producing a predetermined bias signal.

A first transistor 43 has a control signal terminal for receiving an input signal from the photoelectric converting element 41 and a bias signal from the bias signal producing circuit 42.

A second transistor 44 is cascaded to the first transistor 43 and outputs an amplifying signal from the output terminal thereof.

A resonance circuit 45 is connected as a load to the output terminal of the second transistor 44 to resonate a desired frequency component. The resonance circuit 45 is formed of a coil, a capacitor, and a resistor. A voltage dropping resistor 46 is connected between the resonance circuit 45 and the power source 47. A low pass filter 48 is connected between the voltage dropping resistor 46 and the resonance circuit 45.

According to the present invention, the cut-off frequency of the low pass filter 48 is set so as to be lower than the target frequency of the amplifier.

Furthermore according to the present invention, the low pass filter 48 is formed of the high frequency cutting capacitor connected to the resonance circuit 45 and the voltage dropping resistor 46, and the resistance component of the resonance circuit 45.

According to the present invention, the resistance value of the voltage dropping resistor 46 is set so as to equalize the drop voltage of the second transistor 44 with the drop voltage across the voltage dropping resistor 46 through which the main current flows the first transistor 43 and the second transistor 44.

Furthermore, according to the present invention, the voltage dropping resistor is formed of a variable resistor.

According to the present invention, a highpass filter having a cut-off frequency set to near to the target frequency of the amplifier may be arranged to the control terminal of the first transistor 43.

Moreover, according to the present invention, the highpass filter is constituted of a coupling capacitor connected to the control terminal of the first transistor 43, and a resistor in the bias signal producing circuit 42.

According to the present invention, the first transistor 43 and the second transistor 44 are made of a field effect transistor, respectively.

According to the present invention, the first transistor 43 may be formed of a field effect transistor and the second transistor 44 is formed of a bipolar transistor.

According to the present invention, the first condensing means and the second condensing means for condensing further the optical signal condensed by the first condensing means are arranged in the optical signal route inputting to the photoelectric converting element 41. The second condensing means may be arranged adjacent to the light receiving surface of the photoelectric converting element 41.

According to the present invention, the photoelectric converting element 41 is formed of a photo diode. The second condensing means is formed of a convex lens. The convex lens and the photo diode are encapsulated in a resin mold package, with the convex lens arranged near to the light receiving surface of the photo diode.

According to the present invention, the resin mold package is made of a resin mold material which can transmit selectively a wavelength.

In the optical signal input-type amplifier circuit according to the present invention, the photoelectric converting element 41 converts an optical signal into an electric signal, and outputs the electric signal to the first transistor 43.

The first transistor 43 inputs an electric signal from the photoelectric converting element 41 and a bias signal from the bias signal producing circuit 42. The first transistor 43 inputs the signals and outputs a signal to the second transistor 44 cascaded to the first transistor 43.

The second transistor 44 inputs a signal from the first transistor 43 and outputs an amplified signal. The amplified signal is optimized by the synergy effect of the resonance circuit 45, the voltage dropping resistor 46 and the low pass filter 48. According to the present invention, the low pass filter 48 filters at a cutoff frequency lower than the target frequency of the amplifier.

Furthermore, according to the present invention, the filtering of the low pass filter 48 is performed by the high frequency cutting capacitor connected to the voltage dropping resistor 46 and the resonance circuit 45, and the resistance component of the resonance circuit 45.

According to the present invention, the resistance value of the voltage dropping resistor 46 is set so as to equalize the drop voltage determined by the main current flowing the first and second transistors 43 and 44 and the voltage dropping resistor 46 with the drop voltage of the second transistor 44 to output an output signal.

Furthermore, according to the present invention, the variable resistor is varied so as to equalize the drop voltage with the drop voltage of the second transistor in accordance with the main current.

According to the present invention, the highpass filter connected to the control terminal of the first transistor 43 filters the output signal of the second transistor 44 while the cut-off frequency is set near to the target frequency of the amplifier.

Furthermore, according to the present invention, the filtering operation of the highpass filter is performed by the coupling capacitor connected to the control terminal of the first transistor 43 and the resistor in the bias signal producing circuit 42.

According to the present invention, the light inputted to the photoelectric converting element 41 is condensed by the first condensing means. The condensed light is condensed further by the second condensing means arranged near to the light receiving surface of the photoelectric converting element 41 to input the light receiving surface of the photoelectric converting element 41.

Moreover, according to the present invention, the resin mold package which encapsulates a photo diode acting as the photoelectric element 41 can transmit selectively a wavelength of an inputted signal.

Therefore, the optical signal input-type amplifier circuit according to the present invention is characterized by a photoelectric converting element for converting an optical input signal into an electric signal, a bias signal generating circuit for producing a predetermined bias signal, a first transistor having an output terminal, and a control terminal for receiving an input signal from the photoelectric converting element and a bias signal from the bias signal generating circuit, a second transistor cascaded to the first transistor for outputting an amplifying signal from the output terminal, a resonance circuit connected as a load to the output terminal of the second transistor for resonating a predetermined high-frequency component, the resonance circuit being formed of a coil, a capacitor, and a resistor, a voltage dropping resistor connected between the resonance circuit and a power source, and a low pass filter connected to the resonance circuit and the voltage dropping resistor. Thus the expensive regulator circuit is not needed and the manufacturing cost and power consumption can be reduced.

The external disturbing light component can be suppressed by setting the cut-off frequency of the low pass filter to a frequency lower than the target frequency of the amplifier.

The low pass filter is constituted of a high frequency cutting capacitor connected to a voltage dropping resistor, the resonance circuit and the voltage dropping resistor, and a resistance component of the resonance circuit. Since, the resistance component can be shared the function, the device can be effectively miniaturized.

Furthermore, the resistance value of the voltage dropping resistor is set so as to equalize the drop voltage determined by the main current flowing the first and second transistors and the voltage dropping resistor with the drop voltage of the second transistor, whereby the amplifier can be effectively functioned.

Since the voltage dropping resistor is formed of a variable resistor, the drain to source voltage of the transistor or the collector to emitter voltage can be optimized to an optimum value so as to establish the maximum amplitude of the output signal, whereby the current Id with no variation can be outputted controllably at all times.

An external disturbing light can be suppressed effectively and certainly by arranging the highpass filter which is set to a cut-off frequency near to the target frequency of the amplifier arranged near to the first transistor control terminal.

Since the highpass filter is formed of a coupling capacitor connected to the control terminal of the first transistor and the resistor in the bias signal producing circuit, the external disturbing light can be suppressed certainly and the manufacturing cost can be reduced.

Since the first transistor and the second transistor is formed of a field effect transistor respectively, there is an advantage in that the device can be operated to its full function.

Since the first transistor is formed of a field effect transistor and the second transistor is formed of a bipolar transistor, it can be efficiently functioned.

Furthermore, the first condensing means and the second condensing means for condensing further the condensed light by the first condensing means are arranged in the optical signal input route to the photoelectric converting element. The second condensing means is arranged near to the light receiving surface of the photoelectric converting element. Hence the photoelectric converting element with a small light receiving area can be used. Such a method can lead effectively to a reduced power consumption of the amplifier circuit, an improved SN ratio, and a small-sized device.

The photoelectric converting element is formed of a photo diode and the second condensing means is formed of a convex lens. The convex lens and the photo diode are sealed in a resin mold package, with the convex lens arranged near to the light receiving surface of the photo diode. Thus the circuit structure can be realized at a reduced manufacturing cost.

Furthermore, since the resin mold package is formed of a resin mold material which can transmit selectively a wavelength, the external disturbing light can be removed at a light receiving stage. It is possible to facilitate the hard structure of the amplifier circuit so that the manufacturing cost can be effectively reduced.

(b) Explanation of the First Embodiment

Figure 2:
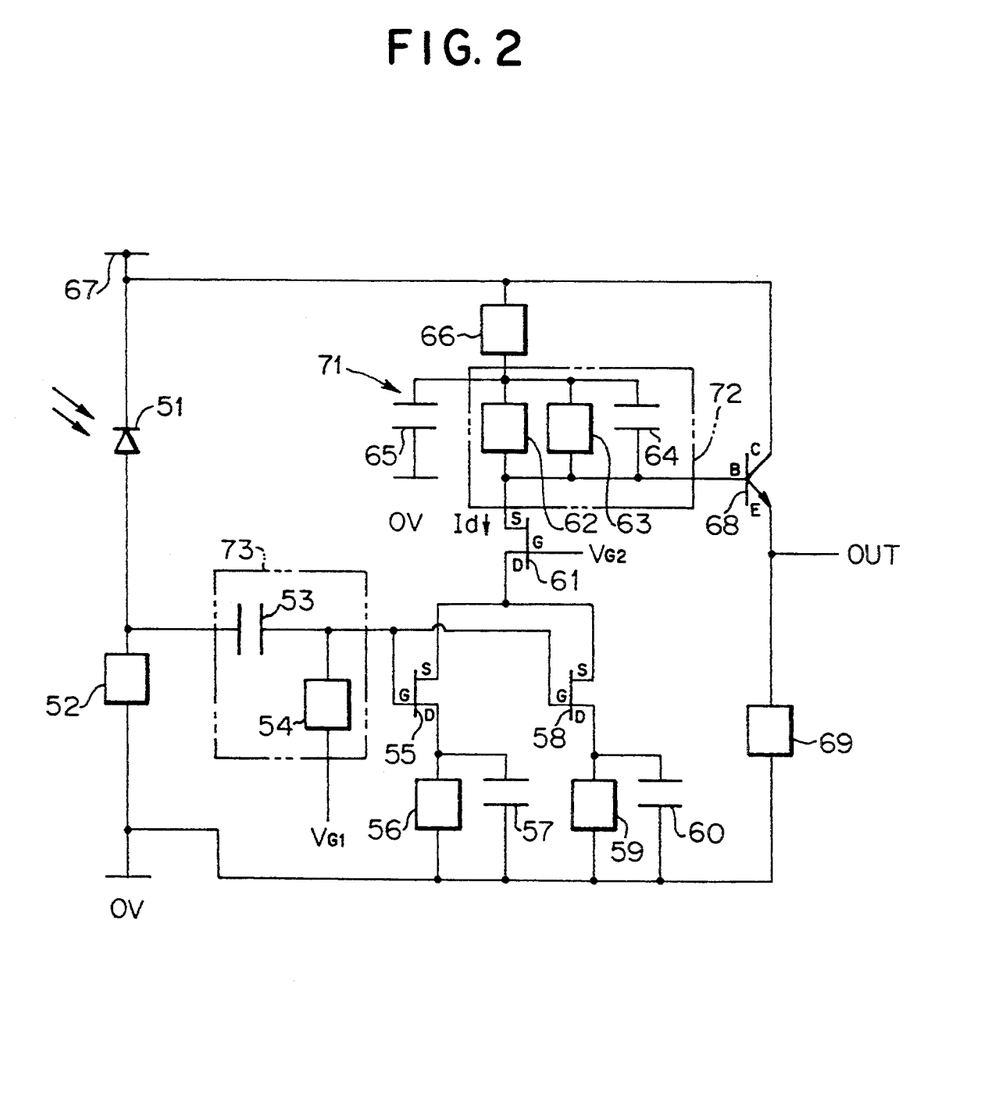
FIG. 2 is a circuit diagram showing the optical signal input amplifier circuit according to the one embodiment of the present invention.

FIG. 2 is a circuit diagram showing the optical signal input-type amplifier circuit according to the first embodiment of the present invention. The optical signal input-type amplifier circuit shown in FIG. 2 is used as the photoelectric converting unit 5 in the optical system 2 in the conventional bar code reader shown in FIG. 8. In FIG. 2, numeral 51 represents a PIN photo diode acting as a photoelectric converting element. The PIN photo diode 51 receives an optical signal (laser beam) from the scanning mechanism 4 and produces the reverse current corresponding to the strength of the optical signal supplied from the power source 67.

Figure 3:
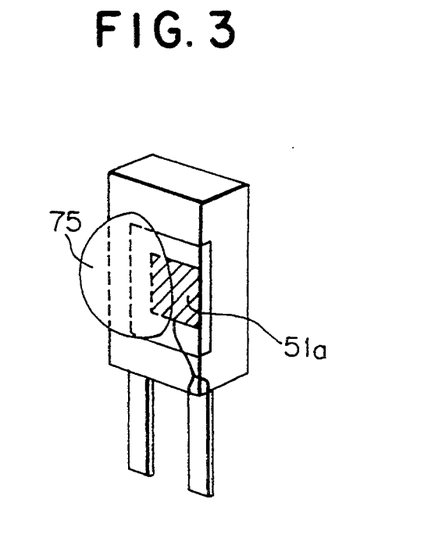
FIG. 3 is a diagram showing a PIN photo diode and a convex lens encapsulated in a resin mold package according to one embodiment of the present invention.
Figure 4A:
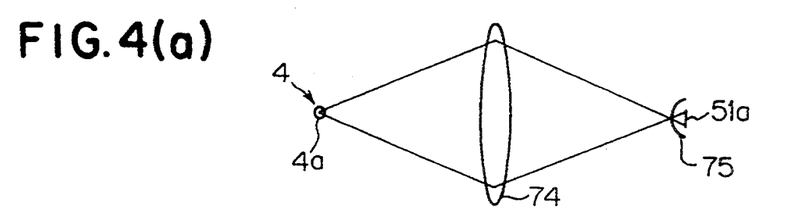
FIGS. 4(a) to 4(c) each are a diagram explaining the input route of an optical signal to the PIN photo diode in one embodiment of the present invention.
Figure 4B:
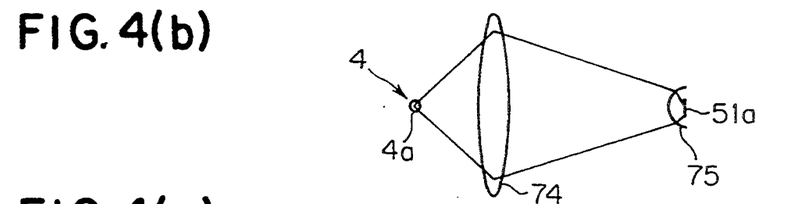
Figure 4C:
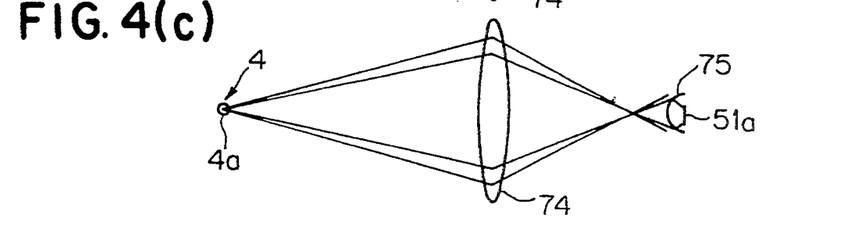

The light receiving portion of the PIN photo diode 51 is formed as shown in FIG. 3 and receives the optical signal as shown in FIGS. 4(a) and 4(c).

That is, since the PIN photo diode 51 and the convex lens 75 are encapsulated in a resin mold package, the light entering the convex lens 75 can be effectively inputted into the light receiving surface 51a of the PIN photo diode 51.

As shown in FIGS. 4(a) to 4(c), the condensing lens 74 in a convex lens shape acting as first condensing means is arranged between the scanning mechanism 4 and the PIN photo diode 51 in the optical signal input-type amplifier circuit. The optical signal from the scanning mechanism 4 is condensed by the condensing lens 74, inputted to the convex lens 75, and focused on the light receiving surface 51a.

The light receiving area 51a of the PIN photo diode 51 is narrower than the light receiving area 11a of the conventional PIN photo diode 11 shown in FIGS. 10(a) to 10(c). According to the present embodiment, the PIN photo diode 51 sealed with a resin mold package is arranged so as to be close to the condensing lens, in comparison with the PIN photo diode 11. Thus the effective light receiving diameter of which the PIN photo diode 11 can receive actually an optical signal is ensured.

Furthermore, the resin mold package sealing the PIN photo diode 51 and the convex lens 75 is formed of, for example, a red clear resin mold material. The resin material can transmit a light having a wavelength of about 633 nm which is used usually for the bar code reader and inputted to the PIN photo diode 51.

Referring to FIG. 2, numeral 52 represents a grounded resistor and 54 represents a bias voltage applying resistor where a bias voltage VG1 is applied.

Numeral 53 represents a coupling capacitor. The capacitor 53 and the resistor 54 have a normal function respectively and form a highpass filter 73 that cuts a low frequency signal working as an external disturbing light component existing in the signal from the PIN photo diode 51.

The cut-off frequency of the highpass filter 73 is set so as to be near to a target frequency or the frequency of a signal outputted to the A/D converter 6 from the optical signal input-type amplifier circuit, determined by the capacitor 53 and the resistor 54. The highpass filter 73 can remove fully the low frequency component of an external disturbing light from a fluorescent lamp.

Numerals 55 and 58 are respectively a field effect transistor (FET). The FETs 55 and 58 are connected in parallel. The FET 55 has a gate terminal which receives a signal from the PIN photo diode 51 and biased with a common voltage, and a drain terminal connected to a resistor 56 and a capacitor 57 connected in parallel to each other. The FET 58 has a gate terminal which receives a signal from the PIN photo diode 51 and biased with a common voltage, and a drain terminal connected to a resistor 59 and a capacitor 60 connected in parallel to each other.

Moreover, the FET 61 is cascaded to the FET 55 and the FET 58 and biased with a bias voltage VG2.

Numeral 72 represents a resonance circuit. The resonance circuit 72 is connected as a load to the source terminal of the FET 61 and resonates a desired high frequency component containing a signal frequency including a bar code information. The resonance circuit 72 is formed of a resistor 62, a coil 63, and a capacitor 64 connected in parallel to one another.

Figure 5:
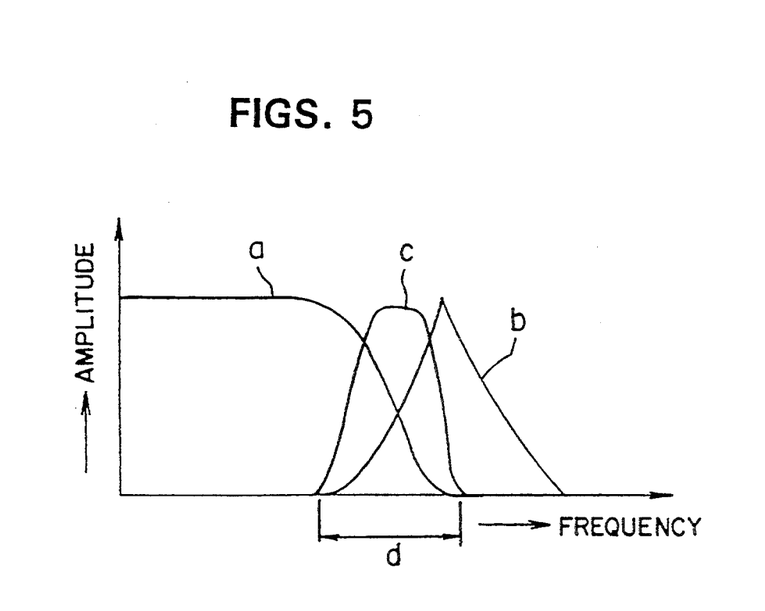
FIG. 5 is a diagram explaining the operation of the optical signal input amplifier circuit according to the first embodiment of the present invention.

That is, since the gate signal to the FETs 55 and 58 has the frequency characteristic shown in FIG. 5(a) accordance to the capacitance of the FET and the photo diode, the amplifying signal is attenuated over the frequency range (d). However the resonance circuit 72 having the frequency characteristic shown in FIG. 5(b) outputs a signal having the frequency characteristic shown in FIG. 5(c).

Numeral 66 represents a voltage dropping resistor. The resistor 66 drops the voltage of the power source 67 to maximize the amplitude of the output signal.

In this case, when the power source 67 supplies, for example, 12 volts, the resistance value of the resistor 66 is set so as to equalize the voltage drop V1 maximizing the amplitude of the output signal to the difference between the power source voltage and the drain to source voltage VDS of the FET 61. That is, the voltage drop V1 is given by the following expression (2):

$$V1 = 12 - VDS \qquad (2)$$

Numeral 65 represents a high frequency cutting capacitor. Three resistance components of the capacitor 65, the resistor 62 and the coil 63 forms a low pass filter 71 which suppresses the variation in the voltage drop of the resistor 66 by passing signals covering low frequency band (less than 100 Hz).

A fluorescent lamp may irradiate an external disturbing light having the intensity several ten times that of the reflection light of the bar code. Hence the current Id flowing through the resistor 66 can increase the performance of the highpass filter 73 but may include noises because the external disturbing light cannot completely removed. The low pass filter 71 has a rectifying function to remove the influence of the external disturbing light component to the current Id.

The low pass filter 71 has the characteristic cutting off over frequencies sufficiently lower than the target frequency of the amplifier in order to remove the external disturbing light. The capacitance value of the capacitor 65 is determined in accordance with the low cut-off frequency. Numeral 69 represents a resistor grounded. Numeral 68 represents a bipolar transistor for outputting an output signal.

In the above structure, the optical signal input-type amplifier circuit according to the present embodiment operates as shown below.

Referring to FIGS. 4(a) to 4(c), the optical signal containing external disturbing light component from the scanning spot 4a is condensed to the convex lens 75 and irradiated to the condensing lens 74. The optical signal condensed further by the convex lens 75 is inputted to the narrow light receiving surface 51a of the PIN photo diode 51.

As for the wavelength of the optical signal inputted to the light receiving surface 51a of the PIN photo diode 51, the red clear mold material sealing the convex lens 75 transmits, for example, only the light of a wavelength of about 633 nm conventionally used in the bar code reader.

The optical signal inputted to the PIN photo diode 51 produces the reverse current according to the intensity of the optical signal to the highpass filter 73 by means of the power source 67.

In the highpass filter 73, the cut-off frequency is set to the target frequency of the amplifier, or a frequency near to the frequency of the signal outputted to the A/D converter 6 to cut the low frequency signal as an external disturbing light component existing in the signal.

The by-pass filter 73 cuts the low frequency component of an electric signal to the gate terminals of the FETs 55 and 58. Voltage differences occur between the drain terminals and the source terminals of the FETs 55 and 58. The current Id flows through the resistor 66 from the power source 67.

The electric signal from the PIN photo diode 51 is supplied to the drain terminal of the FET 61. The electric signal is outputted as an output signal through the bipolar transistor 68 acting as a load the resonance circuit 72 and the resistance 66.

That is, the resonance circuit 72 having the frequency characteristic shown in FIG. 5(b) changes the electric signal attenuation band of the frequency characteristic shown in FIG. 5(a) to the electric signal frequency characteristic shown in FIG. 5(c).

The resistor 66 drops the voltage of the power source 67, or the difference between the power source voltage and the drain to source voltage VDS of the FET 61, shown the expression (2), to a desired voltage V1 to maximize the amplitude of the output signal.

The low pass filter 71 removes an influence of the external disturbing light by filtering noises in the current Id which cannot be completely removed by all means by the highpass filter 73.

The optical signal input-type amplifier circuit according to the first embodiment of the present invention includes the PIN photo diode 51, transistors 56 and 58, the transistor 61, the resonance circuit 72, the resistor 66, and the low pass filter 72. Hence there is an advantage in that it is possible to realize the reduced power consumption of the amplifier circuit, the improved SN ratio, and the miniaturized device.

According to the present embodiment, the light receiving surface 51a of the PIN photo diode 51 arranged near to the condensing lens 74 is sealed with an inexpensive resin mold package 75 which is transparent to wavelengths used conventionally in bar code readers. Hence there is an advantage in that it is possible to realize the circuit simplification and the reduced cost.

(c) Explanation of the Second Embodiment

Figure 6:
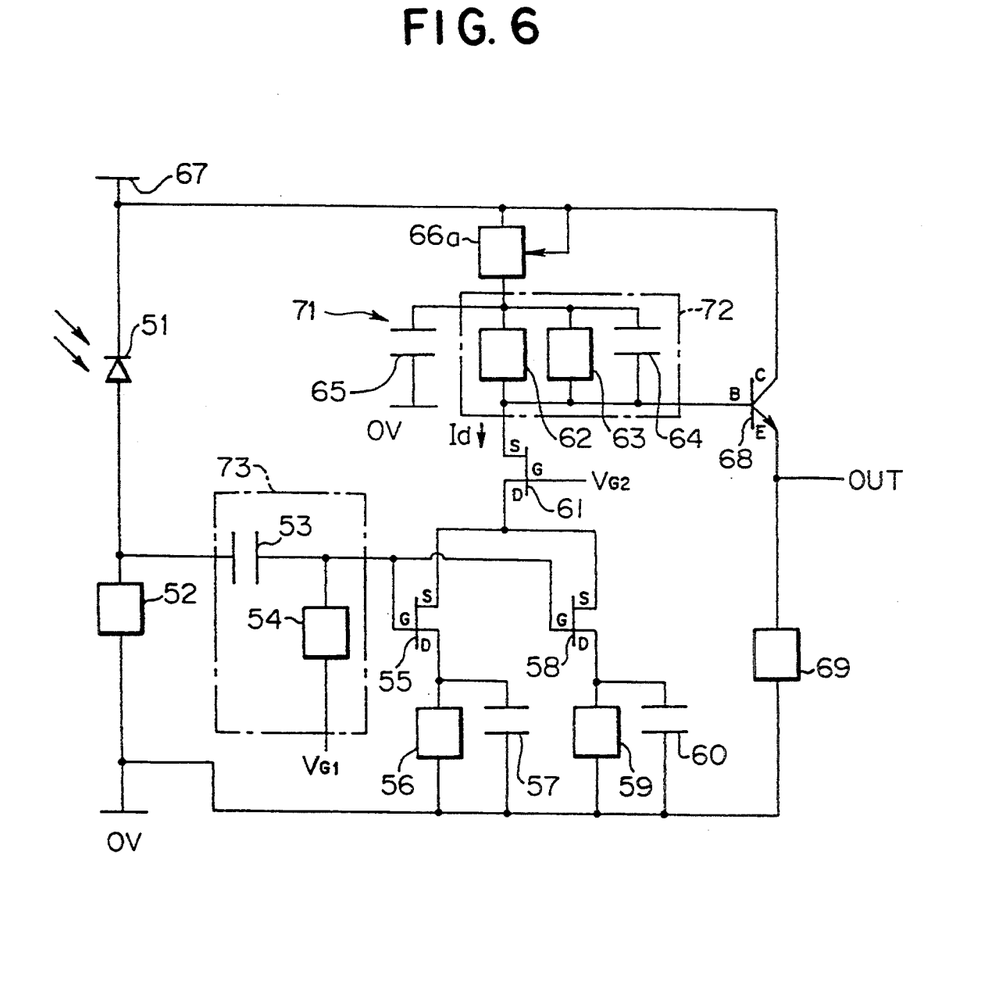
FIG. 6 is a diagram showing the optical input amplifier circuit according to the second embodiment of the present invention.

FIG. 6 is a diagram showing an optical signal input-type amplifier circuit according to the second embodiment of the present invention. FIG. 6 shows an modified embodiment of the optical signal input-type amplifier circuit according to the first embodiment shown in FIG. 2.

That is, the optical signal input-type amplifier circuit according to the second embodiment of the present invention shown in FIG. 6 is different from the optical signal input-type amplifier circuit of the first embodiment in that the variable resistor 66a is used in place of the resistor 66. The other elements are similar to those of the optical signal input-type amplifier circuit of the first embodiment.

The resistor 66a can be adjusted variably in its resistance value. That is, in order to maximize the output signal, the variation of the current Id is absorbed by adjusting the drain to source voltage VDS of the FET 61 at an optimum value so as to satisfy always the expression (2).

The PIN photo diode 51 is sealed in a resin mold package in the similar manner to that in the first embodiment while the light receiving surface 51a of the PIN photo diode 51 is arranged near to the condensing lens 74. The resin mold package transmits a light of a wavelength of about 633 nm used conventionally by a bar code reader.

Therefore the optical signal input-type amplifier circuit according to the second embodiment operates in the similar manner to that of the first embodiment. That is, the optical signal from the PIN photo diode 51 is converted into an electric signal corresponding to the light intensity. The highpass filter 73 extracts a high frequency component of the electric signal. The electric signal is outputted through the bipolar transistor 68 having a load including the resonance circuit 72 and the resistor 66.

In order to obtain the maximum amplitude of the output signal, the drain to source voltage VDS of the transistor 61 is adjusted to an optimum value by varying the variable resistor 66a so that the current Id with no variations is always outputted.

In the optical signal input-type amplifier circuit according to the second embodiment of the present invention, since the resistor 66 in the optical signal input-type amplifier circuit according to the first embodiment is replaced for the variable resistor 66a, the current Id with no variations is always outputted. Therefore there is an advantage in that it is possible to lead to a reduced power consumption in the amplifier circuit, an improved SN ratio, and a reduced device.

In the present embodiment, the PIN photo diode 51 and the condensing lens 74 arranged near to the light receiving surface 51a thereof are encapsulated in an inexpensive resin mold package 75 which is transparent to a light of a wavelength used conventionally in the bar code reader. The present embodiment has an advantage similar to that in the first embodiment.

(d) Explanation of the Third Embodiment

Figure 7:
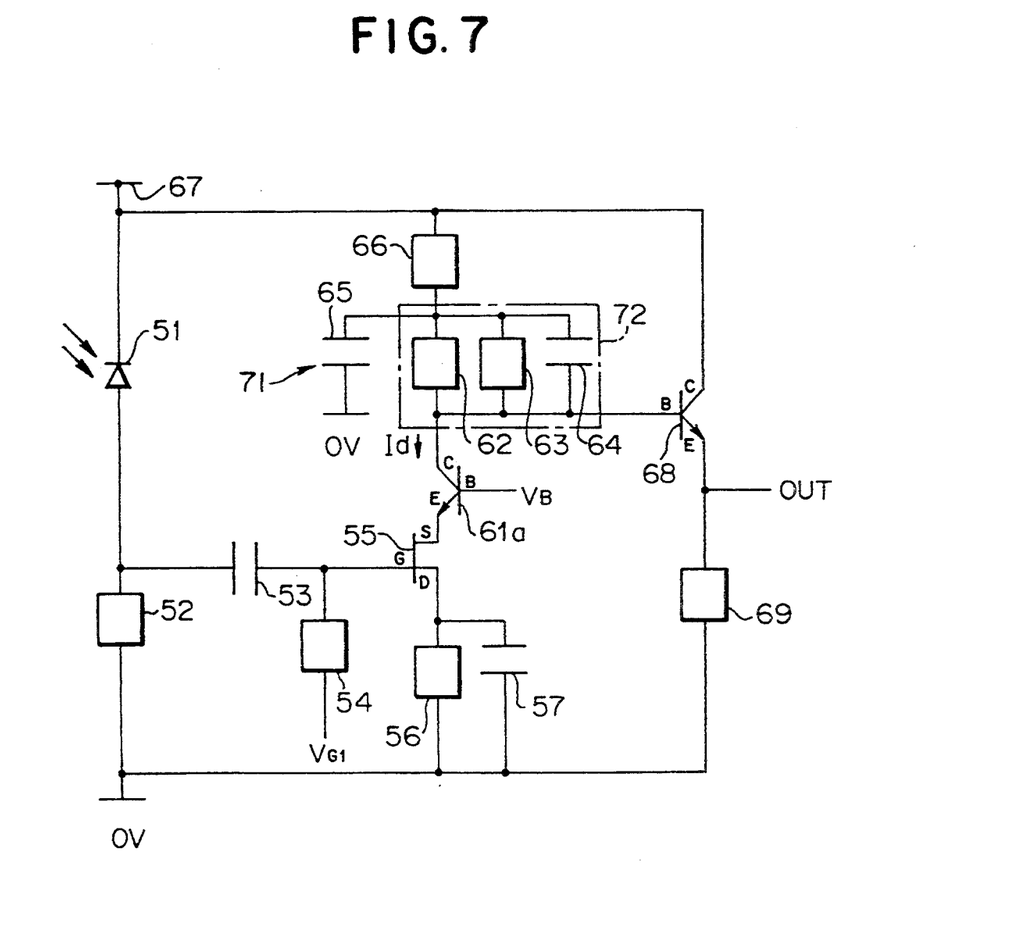
FIG. 7 is a diagram showing the optical input amplifier circuit according to the third embodiment of the present invention.

FIG. 7 is a diagram showing the optical signal input-type amplifier circuit according to the third embodiment of the present invention. The optical signal input-type amplifier circuit shown in FIG. 7 is a modified embodiment of the optical signal input-type amplifier circuit of the first embodiment shown in FIG. 2.

That is, the optical signal input-type amplifier circuit according to the third embodiment of the invention shown in FIG. 7 is different from that in the first embodiment in that the FET 56 and the capacitor 57 are used instead of the FET 56 and the capacitor 57 as well as the FET 58 and the capacitor 59 connected in parallel to each other, and the bipolar transistor 61a biased with a bias voltage VB is used instead of the FET 61. The other circuit configuration is similar to that in the first embodiment.

The PIN photo diode 51 is sealed in a resin mold package, with the light receiving surface 51a thereof arranged near to the condensing lens 74. The resin mold package is transparent to the light of a wavelength of about 633 nm used conventionally in the bar code reader.

In the above structure, the optical signal input-type amplifier circuit according to the third embodiment of the present invention operates substantially similarly to the first embodiment. That is, the optical signal from the PIN photo diode 51 is converted an electric signal corresponding to the intensity of a light. The high frequency of the electric signal is extracted by the highpass filter 73. The electric signal is outputted through the bipolar transistor 68 having a load including a resonance circuit 72 and a resistor 66.

According to the third embodiment, the FET 56 and the capacitor 57 are used instead of the FETs 56 and 58 as well as the capacitors 57 and 59 in the transistor amplifier circuit of the first embodiment. The bipolar transistor 61a is used instead of the FET 61. Hence there is an advantage in that power consumption in the amplifier circuit can be reduced and the device can be small-sized.

According to the present embodiment, the PIN photo diode 51 and the condensing lens 74 arranged near to the light receiving surface 51a thereof is sealed by a resin mold package 75 at low price. The resin mold package is transparent to the light of a wavelength used conventionally in the bar code reader. Hence this embodiment has an advantage similar to the first embodiment.

What is claimed is:

1. An optical signal input-type amplifier circuit, comprising:
    a photoelectric converting element for converting an optical input signal into an electric signal;
    a bias signal generating circuit for producing a predetermined bias signal;
    a first transistor having an output terminal, and a control terminal for receiving an input signal from said photoelectric converting element and a bias signal from said bias signal generating circuit;
    a second transistor having an output terminal cascaded to said first transistor for outputting an amplifying signal from said output terminal of said second transistor;
    a resonance circuit connected as a load to said output terminal of said second transistor for resonating to a predetermined high-frequency component, said resonance circuit being formed of a coil, a capacitor, and a resistor;
    a voltage dropping resistor connected between said resonance circuit and a power source; and
    a low pass filter connected to said resonance circuit and to said voltage dropping resistor.

2. An optical signal input-type amplifier circuit according to claim 1, wherein said low pass filter has cut-off frequency set so as to be lower than a target frequency of an amplifier.

3. An optical signal input-type amplifier circuit according to claim 1, wherein said low pass filter comprises a high frequency cut capacitor and a resistance component of said resonance circuit, said high-frequency cut capacitor connected to said voltage dropping resistor and said resonance circuit.

4. An optical signal input-type amplifier circuit according to claim 2, wherein said low pass filter comprises a high frequency cut capacitor and a resistance component of said resonance circuit, said high-frequency cut capacitor connected to said voltage dropping resistor and said resonance circuit.

5. An optical signal input-type amplifier circuit according to claim 1, wherein the resistance value of said voltage dropping resistor is set so as to equalize a drop voltage determined by a main current flowing through said first transistor, said second transistor and said voltage dropping resistor with a drop voltage of said second transistor.

6. An optical signal input-type amplifier circuit according to claim 1, wherein said voltage dropping resistor comprises a variable resistor.

7. An optical signal input-type amplifier circuit according to claim 3, wherein said voltage dropping resistor comprises a variable resistor.

8. An optical signal input-type amplifier circuit according to claim 4, wherein said voltage dropping resistor comprises a variable resistor.

9. An optical signal input-type amplifier circuit according to claim 2, further comprising a highpass filter connected to a control terminal of said first transistor for setting said cut-off frequency near to said target frequency of an amplifier.

10. An optical signal input-type amplifier circuit according to claim 9, wherein said highpass filter comprises a coupling capacitor connected to a control terminal of said first transistor, and a resistor in said bias signal generating circuit.

11. An optical signal input-type amplifier circuit according to claim 1, wherein said first transistor and said second transistor comprise a field effect transistor, respectively.

12. An optical signal input-type amplifier circuit according to claim 1, wherein said first transistor comprises a field effect transistor, and wherein said second transistor comprises a bipolar transistor.

13. An optical signal input-type amplifier circuit according to claim 1, further comprising first condensing means and second condensing means arranged in a route carrying an optical signal to said photoelectric converting element, the second condensing means condensing further said optical signal condensed by said first condensing means, said second condensing means being arranged adjacent to a light receiving surface of said photoelectric converting element.

14. An optical signal input-type amplifier circuit according to claim 13, wherein said photoelectric converting element comprises a photo diode, and wherein said second condensing means comprises a convex lens, said convex lens and said photo diode being encapsulated in a resin mold package, said convex lens being arranged near to the light receiving surface of said photo diode.

15. An optical signal input-type amplifier circuit according to claim 14, wherein said resin mold package comprises a resin mold material which transmits selectively a wavelength.

* * * * *

UNITED STATES PATENT AND TRADEMARK OFFICE
CERTIFICATE OF CORRECTION

PATENT NO. : 5,412,202
DATED : May 2, 1995
INVENTOR(S) : Sato

It is certified that error appears in the above-indentified patent and that said Letters Patent is hereby corrected as shown below:

Col. 6, line 9, change "Can" to --can--.

Col. 15, line 31, after "has" insert --a--.

Signed and Sealed this

Eighth Day of August, 1995

Attest:

Attesting Officer

BRUCE LEHMAN
Commissioner of Patents and Trademarks